United States Patent [19]

Shattes et al.

[11] 3,710,000

[45] Jan. 9, 1973

[54] HYBRID SUPERCONDUCTING MATERIAL

[75] Inventors: Walter J. Shattes, Bloomfield; William G. Marancik, Basking Ridge, both of N.J.

[73] Assignee: Air Reduction Company, Incorporated, New York, N.Y.

[22] Filed: May 13, 1970

[21] Appl. No.: 36,740

[52] U.S. Cl. ...........174/15 C, 174/126 CP, 174/128, 174/DIG. 6, 335/216

[51] Int. Cl. ............................H01b 7/34, H01b 5/00

[58] Field of Search ...174/15 C, DIG. 6, 36, 126 CP, 174/128; 335/216; 29/599

[56] References Cited

UNITED STATES PATENTS

| | | | |
|---|---|---|---|
| 3,514,850 | 6/1970 | Barber et al. | 29/599 |
| 3,433,892 | 3/1969 | Elbindari | 174/126 |
| 3,504,105 | 3/1970 | Bogner et al. | 174/126 |
| 3,472,944 | 10/1969 | Morton et al. | 174/128 X |
| 3,365,538 | 1/1968 | Voigt | 174/128 |
| 3,502,789 | 3/1970 | Barber et al. | 174/128 |

*Primary Examiner*—Laramie E. Askin
*Assistant Examiner*—A. T. Grimley
*Attorney*—Melford F. Tietze, Edmund W. Bopp and H. Hume Mathews

[57] ABSTRACT

A hybrid superconducting material in which superconducting strands, at least partially surrounded by a layer of low resistance normally conducting material, are embedded in a matrix of high resistance normally conducting material. In a specific embodiment, the superconducting strands consist essentially of niobium titanium, individually surrounded by a thin sleeve of copper, and embedded in a matrix of cupro-nickel. The composite is extruded at elevated temperatures and pressure. The wire so formed may be used for electromagnet coils designed to function in a cryogenic system.

7 Claims, 8 Drawing Figures

INVENTORS
W. SHATTES
W. MARANCIK
BY
Melford F. Pietzo
ATTORNEY

HYBRID SUPERCONDUCTING MATERIAL

BACKGROUND OF THE INVENTION

As is well known, superconducting materials are roughly classified into two general types. Type I superconducting materials, when cooled below their critical temperature, exclude magnetic flux in all fields up to a critical value of field strength beyond which flux completely penetrates the sample, thereby destroying the superconducting state and causing the normal state to reappear. Those superconducting materials known as "Type II", or hard superconductors, completely exclude magnetic flux up to the lower end of a critical range of field strength, within which range a gradual penetration of flux takes place, until the upper limit of the range is reached, at which the flux penetration becomes complete, destroying superconductivity. Within this critical range in Type II superconducting materials, various techniques have been employed to avoid what is known as "flux jumping," such as by reducing the width of the superconducting strands, and forming composites of filamentary strands embedded in matrices of normally conducting material. However, the short sample performance of these composite conductors continues to be impaired by losses due to eddy currents. These are believed to be caused by increasing field strength, which generates lateral voltages in the composite. These give rise to current loops which extend laterally through normally conducting layers from one superconducting strand to the next, and which extend a theoretical length $l_c$ along the composite conductor.

It has been found in the prior art that it is possible to substantially reduce such losses in composite conductors containing multiple superconducting strands by employing various techniques to break up or reduce these eddy current loops, such as by twisting the composite conductor at a pitch which is substantially less than the critical length $l_c$, and also, by interposing between one or more of the superconducting strands a high resistance barrier layer. The criterion of the theoretical length $l_c$ and the interposition of a high resistance barrier layer is discussed in a letter entitled "The Effect of Twist on AC Loss and Stability in Multistrand Superconducting Composites," R. R. Critchlow, B. Zeitlin, and E. Gregory, Applied Physics Letters, Volume 15, No. 7, Oct. 1, 1969.

The foregoing letter refers to the prior art use of cupro-nickel as a suitable high resistance matrix material in which is embedded one or more superconducting strands. It has been found, however, that although a cupronickel matrix, because of its high resistivity within the liquid helium range, is advantageous in reducing transverse (eddy) currents, it is detrimental to current stability.

Accordingly, the principal object of the present invention is to provide a composite of superconducting and normally conducting material in which losses due to eddy currents are substantially reduced, but which has greater current stability than prior art composites developed for this purpose.

SHORT DESCRIPTION OF THE INVENTION

These and other objects are realized in a composite comprising one or more rods of superconducting material individually jacketed in coatings of low resistance normally conducting material, and embedded in a matrix of high resistance normally conducting material. In a preferred embodiment of the invention, rods of niobium titanium, each of which is surrounded by a thin coating of copper, are embedded in a matrix of cupro-nickel. The cupro-nickel matrix is then reduced by extrusion through a die at elevated temperature and pressure, and finally drawn into wire, in such a manner that the copper coated superconducting strands maintain their individual integrity in the wire matrix. The wire, preferably twisted, is then formed into the coil of an electromagnet which becomes operational in a cryogenic system.

It will be apparent that other Type II superconducting materials can be substituted for niobium titanium, in the configurations of the present invention. Moreover, other low resistance normally conducting coatings, such as aluminum, silver, or gold can be substituted for copper. Further, other types of materials which are characterized by high resistivity at liquid hydrogen temperatures can be substituted for cupro-nickel, such as, for example, German (nickel) silver, as disclosed in application Ser. No. 36,739 , filed by J. Nicol, at even date herewith.

The principal advantage of the configuration of superconducting wire of the present invention is that the coatings of low resistance normally conducting material immediately adjacent the superconducting strands have been found to contribute greatly to the current stability of the conductor. Whereas the embedding matrix of high resistance normally conducting material functions to break up eddy currents which tend to form in a rapidly changing magnetic field, thereby reducing losses, the added copper sleeves immediately adjacent the individual superconductor strands tend to greatly reduce flux jumps in the superconducting composite.

These and other features and advantages will be apparent to those skilled in the art in a detailed study of the present invention with reference to the drawings.

It will be understood that there are numerous ways within the skill of the art for preparing a composite in accordance with the present invention.

Figure 1:
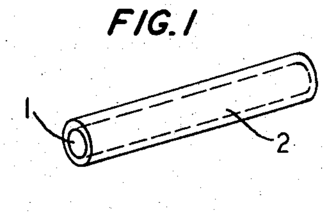
FIG. 1 shows, in perspective, a copper coated superconducting rod, a component of the present invention.

In accordance with one example, a plurality of rods of Type II superconducting material are first forced into sleeves of low resistance material, having a resistivity of the order of $10^{-8}$ ohm-centimeters at 4.2° Kelvin, as shown in FIG. 1. The superconducting material, in the present illustration, consists essentially of 45 percent by weight of what is known as electron beam niobium and 55 percent by weight of what is known as crystal bar titanium. It will be understood, however, that other compositions of niobium titanium, and, in fact, any class II or "hard" superconductor, such as niobium zirconium, which is sufficiently ductile that it does not fracture during the coreduction process, may be employed for the purposes of the present invention.

In the present example, the niobium titanium rods, 0.24 inch in diameter and just under 4 inches long, of the composition first stated, after cleansing with an acid solution, are each forced into a tube formed from what is known in the art as oxygen-free high conductivity copper, having a 5/16 inch outer diameter and an 0.032 inch wall thickness. The ratio of the sleeve wall thickness to the diameter of the superconducting rod may vary. It will be understood that other low resistance normally conducting metals can also be used for this purpose, such as, for example, aluminum, gold, or silver.

Figure 2:
FIGS. 2 and 3 show, in cross-section, variations in the form of the coating shown in FIG. 1.
Figure 3:

Moreover, the low resistance coating sleeve, instead of being a complete annulus, as shown in FIG. 1, may be only partially closed, as shown in FIG. 2, or overlapping in part, as shown in FIG. 3.

Figure 4:
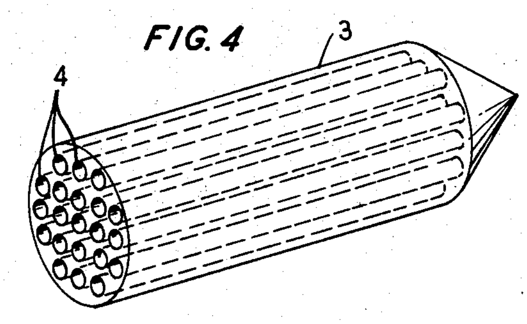
FIG. 4 shows, in perspective, a cupro-nickel matrix element prepared for reception of coated rods of the form of FIGS. 1, 2, or 3.

A matrix billet 3 of high resistance metal is prepared as indicated in FIG. 4 to receive the coated wires, by having holes drilled parallel to the longitudinal axis of the billet.

The billet material, in the present example, is a cupro-nickel alloy, having a composition 10 percent by weight of nickel and 90 percent by weight of copper, although it is contemplated that the alloy used can, for present purposes, contain up to 30% by weight of nickel, and as little as 70 percent by weight of copper. Other high resistance matrix material may be used, including any normally conducting metals having resistivities at liquid helium temperature, which are at least several orders of magnitude greater than that of the low resistance coating material which in the present instance is copper.

In the present example, the billet shown in FIG. 4 is a solid cylinder of cupro-nickel, 2 inches in diameter and 4 inches long, terminating at one end in a conical tip. The holes 4, which are five-sixteenths inch in diameter, are drilled just large enough to accommodate the sleeve-encased superconducting wire of FIG. 1 (or FIGS. 2 and 3, as the case may be). They are drilled parallel to the axis of the billet, beginning at one end and terminating just at the commencement of the conical tip, in a symmetrical pattern as shown. The present embodiment is designed to accommodate 19 rods of superconductor.

The coated rods, after the proper cleansing in an acid bath in a manner well known in the art, are each forced into a corresponding hole in the cupro-nickel matrix. A cupro-nickel lid of the same composition as the body is then welded so as to seal closed the open end of the composite, which has been evacuated prior to sealing.

The composite member is subsequently heated up to a high temperature, say between 1,200° and 1,300°F., and then extruded under a pressure of about 40 tons per square inch absolute, through a die which is one-half inch in diameter, in the present embodiment. The composite is further reduced through additional steps including a conventional wire-drawing operation to a diameter of, say 30 mils, at which diameter the superconductor strands are about 3.8 mils in cross-section, and the annular sleeve thickness is about 0.003 mil. The final product is indicated in cross-section in FIG. 6. The wire then undergoes a final heat treatment at between 350° and 400° C. for between 20 and 100 hours, prior to use.

Figure 5:
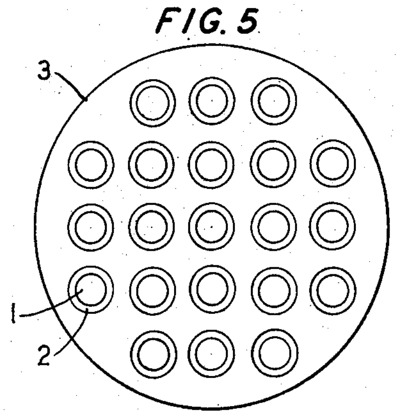
FIG. 5 is a cross-sectional showing of the assembled composite of copper coated superconducting rods in a cupro-nickel matrix.
Figures 7, 8:
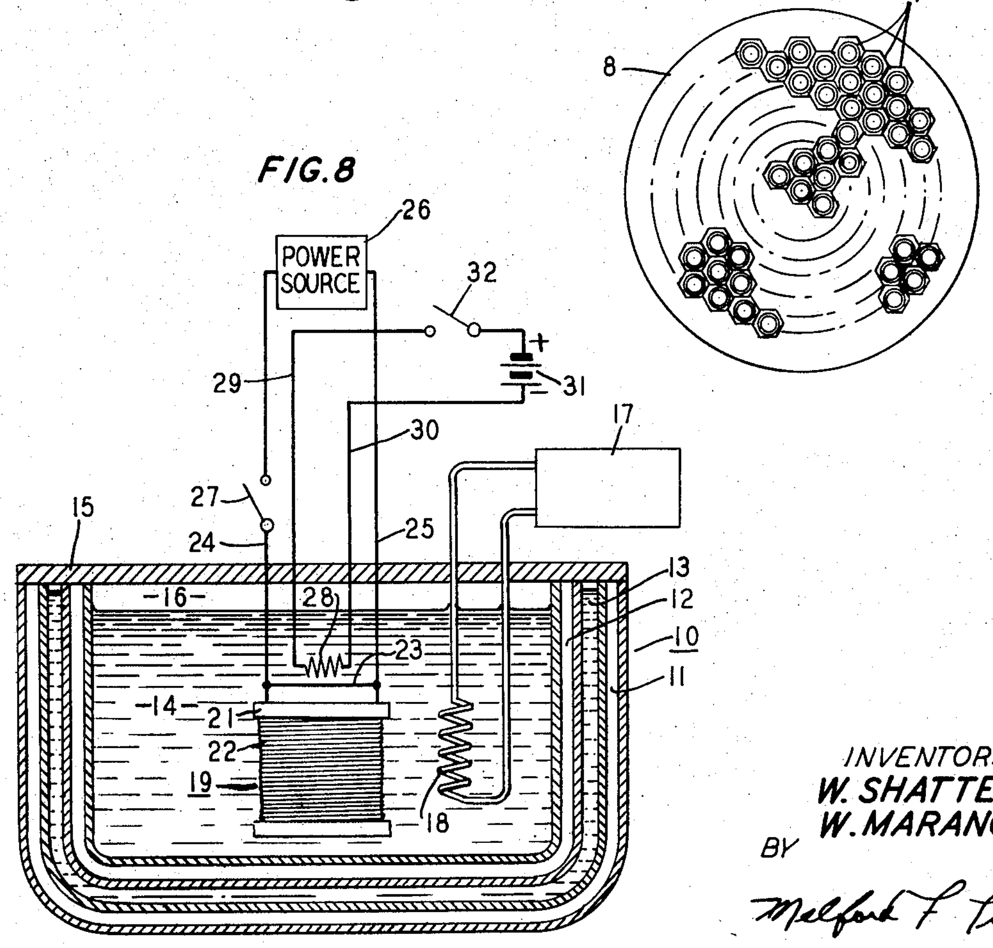
FIG. 7 shows a modification of the invention in which a large number of superconducting rods, coated with an inner coating of copper and an outer coating of cupro-nickel are packed together in hexagonal form.
FIG. 8 shows a cryogenic system including an electromagnetic coil wound with wire in accordance with the present invention.

In a much larger embodiment of the invention than that indicated in FIG. 5, 119 copper coated rods, having an external coating of cupro-nickel, are packed together in hexagonal form, as indicated in FIG. 7 of the drawings. For this embodiment, superconducting rods 0.190 inch in diameter and 9⅞ inches long, are interposed into copper sleeves of equal length, each one-fourth inch in outer diameter and having a 0.025 inch wall thickness. These sleeved rods are then interposed into additional sleeves of cupro-nickel of the same length, each five-sixteenths inch in outer diameter and having an 0.032 inch wall thickness. Each of these doubly coated rods is passed through a die to reduce it to hexagonal cross-sectional shape. The 119 hexagonal shaped rods 7 are then packed together inside of a cylindrical copper can 8, which is 4 inches in outer diameter and one-fourth inch in wall thickness and 10 inches long; and, which terminates in a conical closure at one end. The spaces at the edges are filled in with copper scrap, so that all of the parts fit snugly together. A copper lid is then welded onto the open end, which is evacuated and sealed. This composite is then extruded through a die at an elevated temperature of 1,200° – 1,300° Fahrenheit and a pressure of 500 – 600 tons to an overall cross-section of 1 inch, and is ultimately processed through a wire-drawing operation to a cross-sectional dimension of 20 mils, the superconducting strands and copper sleeves being proportionately reduced. The cupro-nickel hexagonal outer coatings meld together in the reduction process to form a cupro-nickel matrix surrounding the copper coated superconducting strands. The wire product undergoes a final heat treatment before use, as described with reference to the previous embodiment.

Prior to use, the wire in accordance with the present invention is preferably twisted in accordance with the teachings of the publication of Oct. 1, 1969, by Critchlow, Zeitlin, and Gregory, supra.

Figure 6:
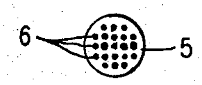
FIG. 6 shows, in cross-section, the composite of FIG. 5 after reduction to wire.

It will be understood that a wire, for example, of the type indicated in FIG. 6, or alternative forms in accordance with the present invention, is wound into a superconducting magnet which is assembled for operation in a cryogenic environment 10, such as indicated in FIG. 8 of the drawings. The magnet 19 is interposed in a double-walled Dewar type flask having inner and outer vacuum chambers 11 and 12 which include between them an intermediate chamber 13 containing liquid nitrogen. The Dewar-type container 10 is closed at the top by a hermetically sealed metal lid 15, comprising any of the metals well known in the art for cryogenic applications. Prior to operation of the device, the Dewar-type container 10 is filled with a bath of liquid helium 14 to a point near the top, the space between the top of the liquid 14 and the top 15 being filled with gas helium 16. The helium bath 14 is kept at a temperature within the range 1°–10° Kelvin by means of a system comprising a liquid helium refrigeration circuit 17 of any type well known in the art for application in the temperature range of interest. A coil 18 of refrigeration circuit 17 is disposed in the bath 14.

The magnet 19, which comprises a large number of turns 22 of wire of the type indicated, for example, in FIG. 4, is mounted on a mandrel or spool 21. This may comprise, for example, a hollow perforated cylindrical structure of aluminum, which is subject to internal and external cooling by the helium bath. Connected to the two ends of the superconducting coil 22 is a pair of ordinary conducting wires 24 and 25, which are passed through hermetical seals in the lid 15. The lead 24 passes through a single-throw control switch 27 to the positive terminal of a source of power 26 for energizing the magnet 19. The power source 26 may either be an alternating current source designed to produce high alternating field sweeps of up to the order of 2,000 gauss per second; or alternatively, a direct current source designed to produce large pulsed fields at a similar rate. The negative terminal of the source 26 is connected to lead 25. The wires 24 and 25 are interconnected across the magnet 19 by a shunt 23. Adjacent the shunt 23 is a high resistance heating coil 28 which is energized through a pair of normally conducting leads 29 and 30. These pass through hermetical seals in the lid 35 and are connected to opposite terminals of a source of power 31 under control of the switch 32. The heating coil 28 serves to control the operation of the superconducting coil 22, by raising the coil above the superconducting range of temperatures when it is desired to terminate superconductivity in the magnet 19.

It will be understood that wire fabricated in accordance with the teachings of the present invention can be employed for other types of superconducting circuits, than the magnet described herein by way of illustration. For example, it can be employed as a prereduced matrix element in hollow conductors of the types disclosed in application Ser. No. 36,741 , filed at even date herewith by W. Shattes, W. Marancik, and B. Kirk. It will be further understood that variations in the structure and techniques of the present invention from the illustrative examples herein described will be apparent to those skilled in the art, within the scope of the appended claims.

What is claimed is:

1. An electrical conductor comprising in combination a composite including along its length at least one strand of Type II superconducting material having a contiguous coating consisting essentially of copper, said composite being surrounded along its length by a high resistivity normally conducting material consisting essentially of an alloy of copper and nickel having a composition within the range comprising not less than 70 percent by weight of copper and not more than 30 percent by weight of nickel.

2. The combination in accordance with claim 1 wherein said Type II superconducting material consists essentially of an alloy of niobium and titanium.

3. The combination in accordance with claim 1 comprising a plurality of strands of niobium titanium, each having a coating layer of oxygen free high conductivity copper, each of said coated strands being embedded in a matrix consisting essentially of said high resistivity normally conducting material.

4. The combination in accordance with claim 3 wherein said conductor takes the form of a wire comprising said matrix including a large number of said strands, which is the product of extrusion at elevated temperature and pressure, and is characterized by the individual integrity of said superconducting strands in said matrix.

5. The combination in accordance with claim 4 wherein said wire product is twisted.

6. A cryogenic system comprising electrical superconducting wire in accordance with claim 4.

7. A cryogenic system comprising electrical superconducting wire in accordance with claim 1.

* * * * *